(12) United States Patent
Yu et al.

(10) Patent No.: US 10,950,514 B2
(45) Date of Patent: Mar. 16, 2021

(54) PACKAGED SEMICONDUCTOR DEVICES AND METHODS OF PACKAGING SEMICONDUCTOR DEVICES

(71) Applicant: Taiwan Semiconductor Manufacturing Company, Ltd., Hsinchu (TW)

(72) Inventors: Chen-Hua Yu, Hsinchu (TW); Chung-Shi Liu, Hsinchu (TW); Chih-Fan Huang, Kaohsiung (TW); Chih-Wei Lin, Zhubei (TW); Wei-Hung Lin, Xinfeng Township (TW); Ming-Da Cheng, Taoyuan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 16/829,275

(22) Filed: Mar. 25, 2020

(65) Prior Publication Data
US 2020/0227331 A1    Jul. 16, 2020

Related U.S. Application Data

(60) Continuation of application No. 16/390,437, filed on Apr. 22, 2019, now Pat. No. 10,629,508, which is a
(Continued)

(51) Int. Cl.
*H01L 23/31* (2006.01)
*H01L 25/10* (2006.01)
(Continued)

(52) U.S. Cl.
CPC ........ *H01L 23/3114* (2013.01); *H01L 21/561* (2013.01); *H01L 21/565* (2013.01);
(Continued)

(58) Field of Classification Search
CPC . H01L 24/73; H01L 24/18; H01L 2224/0401; H01L 21/563; H01L 23/3114; H01L 23/3677; H01L 25/105; H01L 2224/32225; H01L 2924/00012; H01L 2924/181; H01L 2224/73204; H01L 23/5389; H01L 21/568; H01L 23/49816; H01L 24/19; H01L 24/97; H01L 2224/12105; H01L 2224/73267; H01L 23/367; H01L 2224/48227; H01L 2924/15311; H01L 2224/04105; H01L 21/561; H01L 23/49811; H01L 23/3128;
(Continued)

(56) References Cited

U.S. PATENT DOCUMENTS 8,193,624 B1    6/2012  Sohn
8,980,691 B2    3/2015  Lin
(Continued)

*Primary Examiner* — Jasmine J Clark
(74) *Attorney, Agent, or Firm* — Slater Matsil, LLP

(57) ABSTRACT

Packaged semiconductor devices and methods of packaging semiconductor devices are disclosed. In some embodiments, a packaged semiconductor device includes an integrated circuit die, a molding compound disposed around the integrated circuit die, and an interconnect structure disposed over the integrated circuit die and the molding compound. The molding compound is thicker than the integrated circuit die.

20 Claims, 11 Drawing Sheets

Related U.S. Application Data continuation of application No. 15/906,399, filed on Feb. 27, 2018, now Pat. No. 10,269,673, which is a continuation of application No. 14/995,865, filed on Jan. 14, 2016, now Pat. No. 9,911,675, which is a division of application No. 14/180,208, filed on Feb. 13, 2014, now Pat. No. 9,252,135.

(51) Int. Cl.

| | | |
|---|---|---|
| *H01L 21/56* | (2006.01) | |
| *H01L 23/528* | (2006.01) | |
| *H01L 21/768* | (2006.01) | |
| *H01L 21/82* | (2006.01) | |
| *H01L 23/04* | (2006.01) | |
| *H01L 23/367* | (2006.01) | |
| *H01L 23/538* | (2006.01) | |
| *H01L 23/00* | (2006.01) | |
| *H01L 23/498* | (2006.01) | |

(52) U.S. Cl.
CPC .......... *H01L 21/568* (2013.01); *H01L 21/768* (2013.01); *H01L 21/82* (2013.01); *H01L 23/04* (2013.01); *H01L 23/3135* (2013.01); *H01L 23/3142* (2013.01); *H01L 23/367* (2013.01); *H01L 23/49811* (2013.01); *H01L 23/49822* (2013.01); *H01L 23/528* (2013.01); *H01L 23/5384* (2013.01); *H01L 23/5389* (2013.01); *H01L 24/18* (2013.01); *H01L 24/19* (2013.01); *H01L 24/96* (2013.01); *H01L 24/97* (2013.01); *H01L 25/105* (2013.01); *H01L 23/3128* (2013.01); *H01L 23/49816* (2013.01); *H01L 24/73* (2013.01); *H01L 2224/04105* (2013.01); *H01L 2224/12105* (2013.01); *H01L 2224/16225* (2013.01); *H01L 2224/32225* (2013.01); *H01L 2224/48096* (2013.01); *H01L 2224/48227* (2013.01); *H01L 2224/48465* (2013.01); *H01L 2224/73204* (2013.01); *H01L 2224/73265* (2013.01); *H01L 2224/73267* (2013.01); *H01L 2225/1035* (2013.01); *H01L 2225/1058* (2013.01); *H01L 2924/12042* (2013.01); *H01L 2924/15311* (2013.01); *H01L 2924/181* (2013.01); *H01L 2924/18162* (2013.01)

(58) Field of Classification Search
CPC ............. H01L 23/5384; H01L 2924/00; H01L 2224/16225
See application file for complete search history.

(56) References Cited

U.S. PATENT DOCUMENTS

| | | | |
|---|---|---|---|
| 2006/0012082 | A1 | 1/2006 | Marc |
| 2010/0044845 | A1* | 2/2010 | Funaya ............... H01L 21/6835 257/685 |
| 2010/0237477 | A1 | 9/2010 | Pagaila et al. |
| 2011/0210450 | A1 | 9/2011 | Theuss et al. |
| 2011/0285007 | A1 | 11/2011 | Chi et al. |
| 2011/0298137 | A1 | 12/2011 | Pagaila et al. |
| 2014/0252631 | A9 | 9/2014 | Pagaila et al. |
| 2015/0021754 | A1* | 1/2015 | Lin .................... H01L 23/5389 257/712 |
| 2015/0262844 | A1 | 9/2015 | Meyer et al. |
| 2015/0340307 | A1 | 11/2015 | Gabler et al. |
| 2016/0133686 | A1 | 5/2016 | Liao et al. |

* cited by examiner

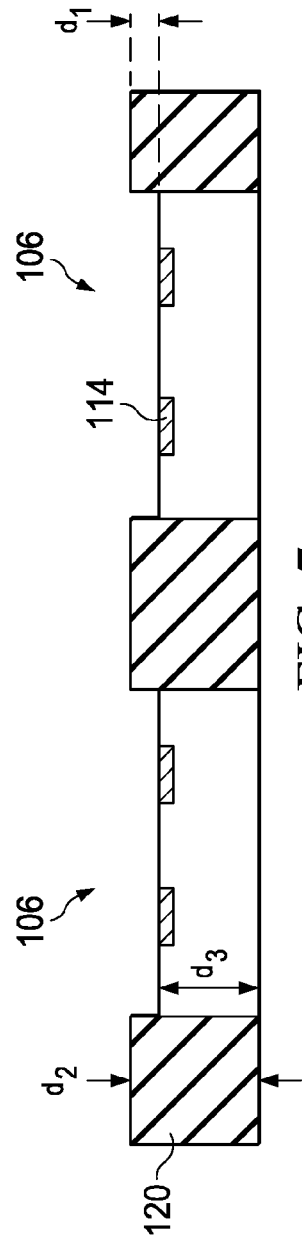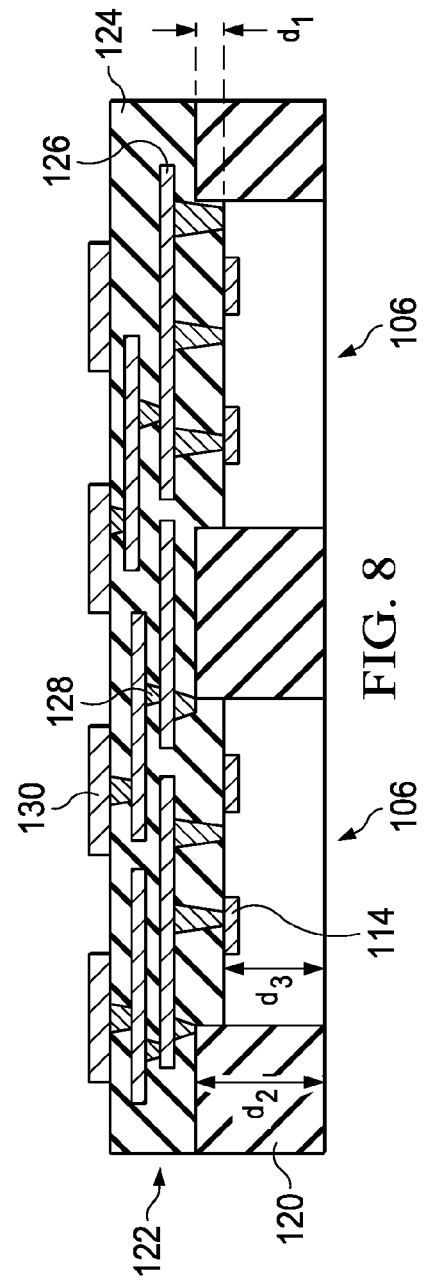

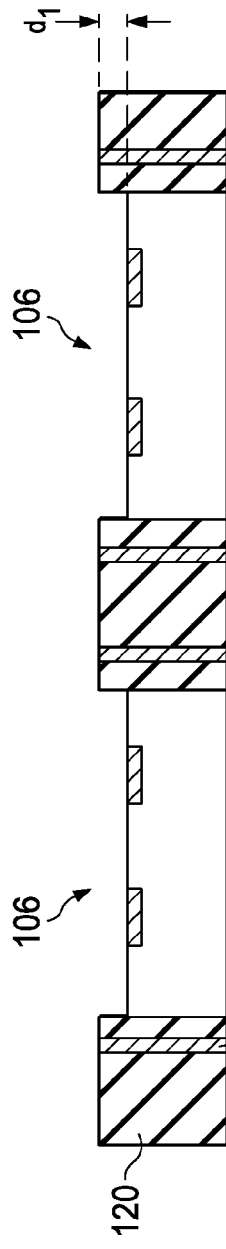
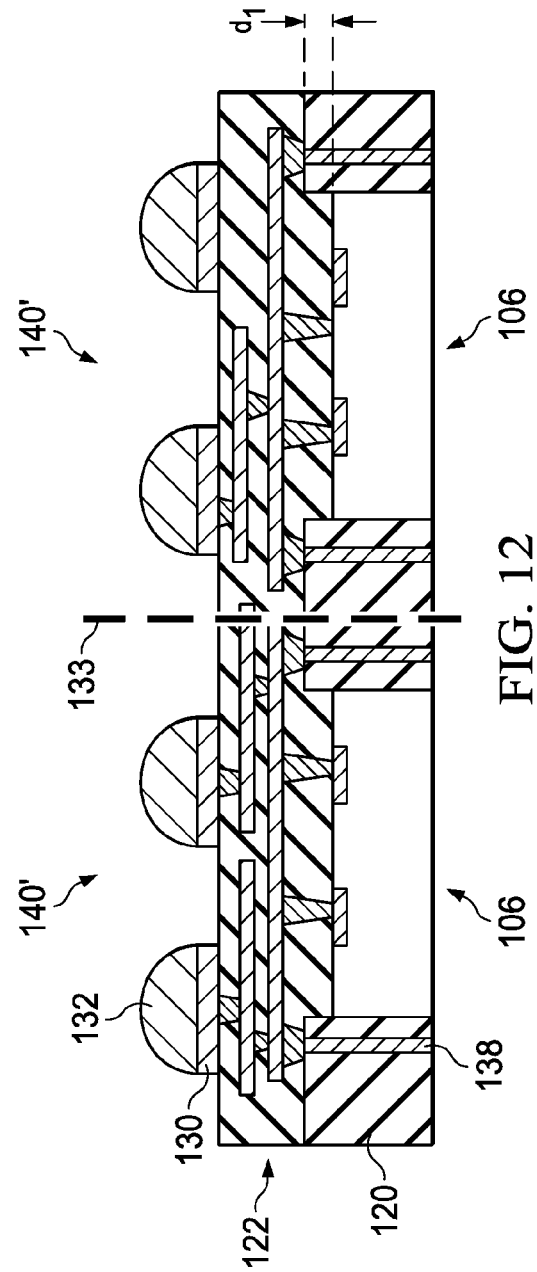

PACKAGED SEMICONDUCTOR DEVICES AND METHODS OF PACKAGING SEMICONDUCTOR DEVICES

PRIORITY CLAIM AND CROSS-REFERENCE

This application is a continuation of U.S. patent application Ser. No. 16/390,437, filed on Apr. 22, 2019, and entitled "Packaged Semiconductor Devices and Methods of Packaging Semiconductor Devices," now U.S. Pat. No. 10,629,508, which is a continuation of U.S. patent application Ser. No. 15/906,399, filed on Feb. 27, 2018, and entitled "Packaged Semiconductor Devices and Methods of Packaging Semiconductor Devices," now U.S. Pat. No. 10,269,673 issued on Apr. 23, 2019, which is a continuation of U.S. patent application Ser. No. 14/995,865, filed on Jan. 14, 2016, and entitled "Packaged Semiconductor Devices and Methods of Packaging Semiconductor Devices," now U.S. Pat. No. 9,911,675 issued on Mar. 6, 2018, which is a division of U.S. patent application Ser. No. 14/180,208, filed on Feb. 13, 2014, and entitled "Packaged Semiconductor Devices and Methods of Packaging Semiconductor Devices," now U.S. Pat. No. 9,252,135 issued on Feb. 2, 2016, which applications are incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, as examples.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 10 illustrate cross-sectional views of a method of packaging semiconductor devices at various stages in accordance with some embodiments of the present disclosure.

FIGS. 11 and 12 illustrate cross-sectional views of a method of packaging semiconductor devices at various stages in accordance with some embodiments.

DETAILED DESCRIPTION

Figure 1:
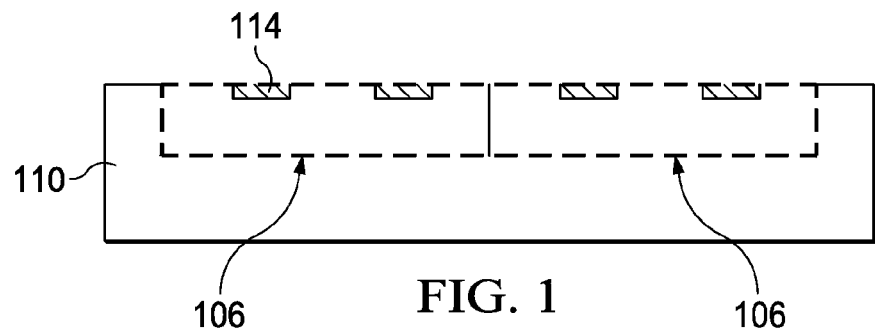

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure provide novel methods and structures for packaging semiconductor devices. A sacrificial layer is formed over integrated circuit dies prior to forming a molding compound around the dies, and the sacrificial layer is later removed. The sacrificial layer prevents molding compound residue from forming on the integrated circuit dies, and the formation of recesses between the integrated circuit dies and the molding compound is reduced or prevented.

FIGS. 1 through 10 illustrate cross-sectional views of a method of packaging semiconductor devices at various stages in accordance with some embodiments. Referring first to FIG. 1, a workpiece 110 is provided that includes a plurality of integrated circuit dies 106. The workpiece 110 may include a semiconductor substrate comprising silicon or other semiconductor materials and may be covered by an insulating layer, for example. The workpiece 110 may also include other active components or circuits, not shown. The workpiece 110 may comprise silicon oxide over single-crystal silicon, for example. The workpiece 110 may conductive layers or semiconductor elements, e.g., transistors, diodes, etc. Compound semiconductors, GaAs, InP, Si/Ge, or SiC, as examples, may be used in place of silicon. The workpiece 110 may comprise a silicon-on-insulator (SOI) or a germanium-on-insulator (GOI) substrate, as examples. The workpiece 110 may comprise a wafer or strip comprising the plurality of integrated circuit dies 106, for example. Alternatively, the workpiece 110 may comprise other types of materials, material layers, and components formed thereon.

The integrated circuit dies 106 are formed within and/or over the workpiece 110 may include a plurality of connectors such as contact pads 114 disposed on a surface thereof. The contact pads 114 may comprise Cu, Al, other metals, or alloys, combinations, or multiple layers thereof, for example. The contact pads 114 may be disposed within an insulating material (not shown) which may comprise silicon nitride, silicon dioxide, other insulators or polymers, or combinations or multiple layers thereof, for example. The contact pads 114 may be coupled to internal wiring of the integrated circuit dies 106, such as to vias and/or conductive lines in metallization layers or polysilicon layers of the integrated circuit dies 106, as examples, not shown.

Figure 2:
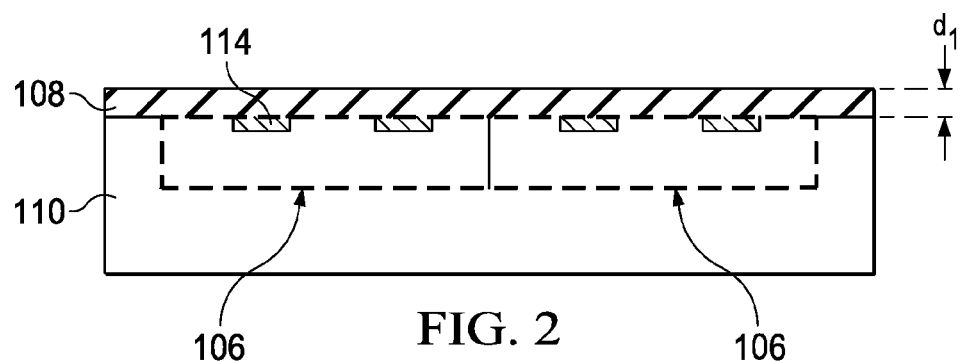

Referring next to FIG. 2, a sacrificial layer 108 is formed over the workpiece 110, e.g., over the integrated circuit dies 106. The sacrificial layer 108 comprises a photoresist material, an organic material, a polymer material, other materials that solidify after curing, and/or combinations of multiple layers thereof, in some embodiments, for example. In some embodiments, the sacrificial layer 108 comprises polybenzoxazole (PBO), as an example. The sacrificial layer 108 is formed in some embodiments using a spin-on method, chemical vapor deposition (CVD), a spin coating process, a printing process, or other coating methods, as examples. The sacrificial layer 108 comprises a material layer having a thickness comprising dimension $d_1$, wherein dimension $d_1$ comprises about 2 μm to about 5 μm in some embodiments. In some embodiments, dimension $d_1$ comprises about 1 μm to about 10 μm, as another example. Alternatively, the sacrificial layer 108 may comprise other materials, dimensions, and formation methods.

Figure 3:
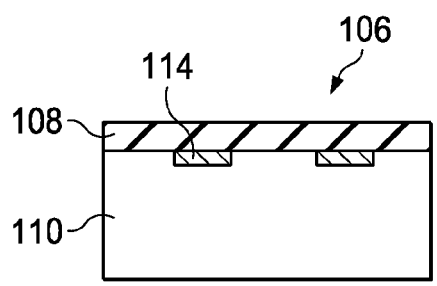

The integrated circuit dies 106 are singulated along scribe lines (not shown) using a die saw, laser, or other device, to form a plurality of separated integrated circuit dies 106, as shown in FIG. 3, which shows a single integrated circuit die 106. In some embodiments, a backside of the workpiece 110 may be thinned using a grinding process prior to the singulation process, for example. In other embodiments, the backside of the workpiece 110 is not thinned.

Figure 4:
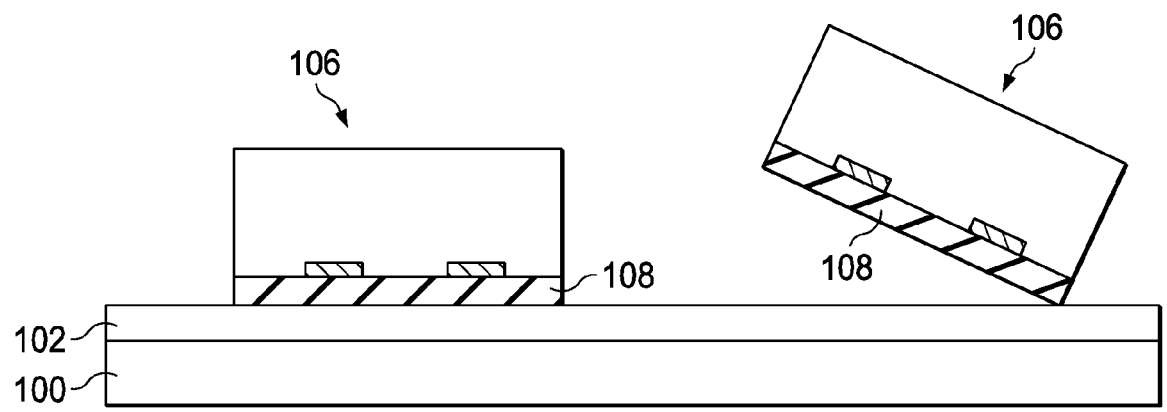

Next, a carrier 100 is provided, as shown in FIG. 4. The carrier 100 may comprise a wafer such as a semiconductor wafer, or the carrier 100 may comprise an organic substrate or other types of substrates. The carrier 100 comprises a sacrificial component that will be removed after one or more integrated circuit dies 106 are packaged, such as integrated circuit dies 106 shown in FIG. 3. The carrier 100 may later be cleaned and used to package other semiconductor devices, for example. Alternatively, the carrier 100 may be discarded after the packaging process.

The carrier 100 includes a foil and die bond material 102 formed thereon. The foil facilitates in the later removal of the carrier 100 from integrated circuit dies 106, for example. The die bond material assists in adhering the integrated circuit dies 106 to the carrier 100, for example. In some embodiments, the die bond material of the foil and die bond material 102 also includes a temperate bond layer that is coated on the top surface of the carrier 100. The temperate bond layer may comprise about 1 μm to about 10 μm of a light to heat conversion (LTHC) material supplied by 3M, for example. The temperate bond layer may be formed using a deposition process or a spin coating process, as examples. Alternatively, the foil and die bond material 102 may comprise other materials, dimensions, and formation methods. In some embodiments, the foil and die bond material 102 is not included.

A plurality of the integrated circuit dies 106 shown in FIG. 3 are inverted and are attached to the carrier 100, as shown in FIG. 4. The sacrificial layer 108 disposed over the integrated circuit dies 106 is coupled to the top surface of the carrier 100, for example. In some embodiments, a die attach film (DAF) (not shown) may be formed over the sacrificial layer 108 before or after the singulation process for the integrated circuit dies 106, for example. The DAF may comprise a glue, an adhesive, or an adhesive film that is adapted to adhere the integrated circuit dies 106 to the foil and die bond material 102 disposed over the carrier 100 in some embodiments, for example. In some embodiments, a DAF is not included. The integrated circuit dies 106 may be attached over the carrier 100 (e.g., over the foil and die bond material 102 disposed over the carrier 100) using a pick-and-place machine, other mechanism, or manually, for example.

In some embodiments, a single integrated circuit die 106 is coupled over the carrier 100 (not shown). In other embodiments, a plurality of integrated circuit dies 106 are coupled over the carrier 100. In some embodiments, the integrated circuit dies 106 are packaged individually in separate packages. In other embodiments, a plurality of the integrated circuit dies 106 are packaged together side-by-side in a single package, e.g., in a two-dimensional (2D) packaging scheme. Two or more of the integrated circuit dies 106 may be packaged together in accordance with some embodiments, for example.

Figure 5:
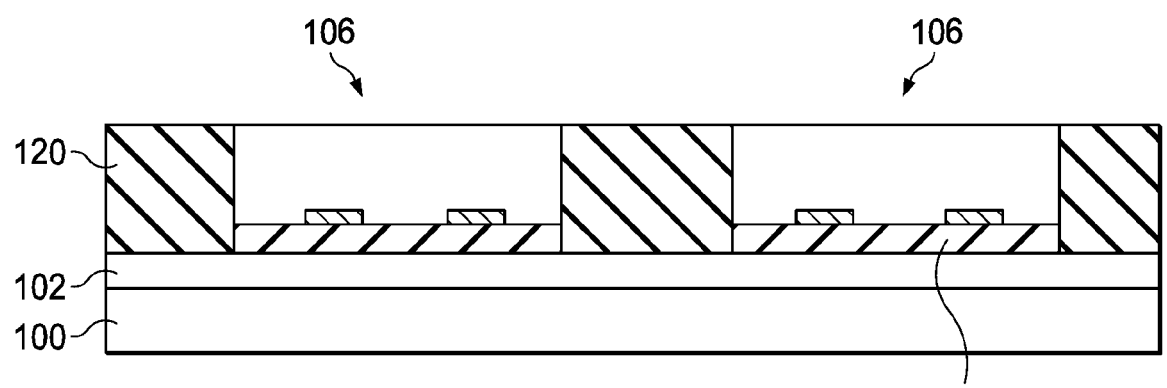

After the integrated circuit dies 106 are coupled to the carrier 100, a molding compound 120 is disposed around the integrated circuit dies 106 over the carrier 100, as shown in FIG. 5. The molding compound 120 is formed using a laminating process or other process, in some embodiments. The molding compound 120 fills spaces between the dies 106 and encapsulates the dies 106, for example. The molding compound 120 comprises a molding material and may comprise epoxy, an organic polymer, or a polymer with a silica-based or glass filler added, as examples. In some embodiments, the molding compound 120 comprises a liquid molding compound (LMC) that is a gel type liquid when applied. Alternatively, the molding compound 120 may comprise other insulating materials and may be applied using other methods. The molding compound 120 is then cured using a heating process, infrared (IR) energy exposure process, an ultraviolet (UV) light exposure process, or other methods, as examples.

If the molding compound 120 extends over a top surface of the integrated circuit dies 106 after the curing process, the molding compound 120 is removed from over the integrated circuit dies 106 using a chemical-mechanical polish (CMP), grinding process, etch process, and/or other methods in some embodiments, for example. Because the sacrificial layer 108 is disposed over the integrated circuit dies 106 during the molding compound 120 application and curing process, the molding compound 120 does not reside over the integrated circuit dies 106 after the application and curing process for the molding compound 120 in some embodiments, for example. The molding compound 120 is formed around the integrated circuit dies 106 in some embodiments.

Figure 6:
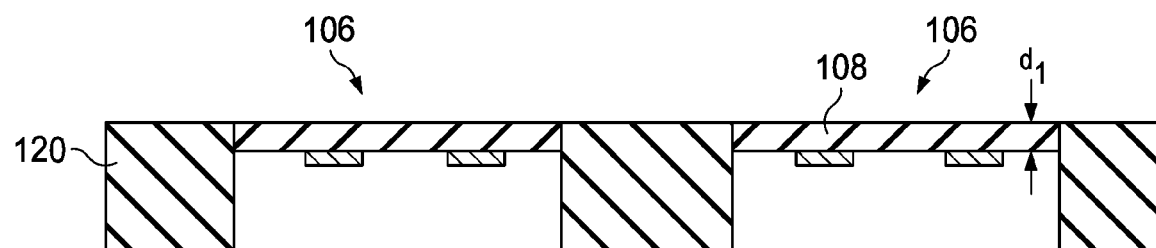

The carrier 100 and foil and die bond material 102 are removed, as shown in FIG. 6. The carrier 100 may be removed using a de-bonding process, and the foil and die bond material 102 are removed by peeling the foil and using a cleaning process to remove the die bond material, for example.

The sacrificial layer 108 is removed, as shown in FIG. 7. The sacrificial layer 108 is removed in some embodiments using an organic solvent, an organic acid, or other materials. The sacrificial layer 108 may be removed using as isopropyl alcohol (IPA), acetone, or ethanol in some embodiments, as examples. A surface of the integrated circuit dies 106 and the contact pads 114 is left exposed after the removal of the sacrificial layer 108. In some embodiments, a top portion of the molding compound 120 in the view shown in FIG. 7 may be removed in the removal process for the sacrificial layer 108. In other embodiments, a top portion of the molding compound 120 is not removed.

Because the sacrificial layer 108 was disposed over the integrated circuit dies 106 during the molding compound 120 application and curing process, the molding compound 120 does not reside over the integrated circuit dies 106 in some embodiments, for example. In other embodiments, a portion of the molding compound 120 may form over the sacrificial layer 108, and the portion of the molding compound 120 disposed over the sacrificial layer 108 is advantageously removed during the removal of the sacrificial layer 108.

The molding compound 120 has a first thickness comprising dimension $d_2$ in some embodiments, and the integrated circuit dies 106 have a second thickness comprising dimension $d_3$ in some embodiments. Dimensions $d_2$ and $d_3$ may comprise about 100 µm to about 500 µm, as examples. Dimension $d_2$ is greater than dimension $d_3$ in some embodiments. Dimension $d_2$ is greater than dimension $d_3$ by about dimension $d_1$ in some embodiments, for example. Dimension $d_1$ comprises a thickness of the sacrificial layer 108, and dimension $d_1$ also comprises a difference in the thicknesses of the molding compound 120 and the integrated circuit dies 106, for example.

Dimension $d_1$ also comprises an amount of a step height between the integrated circuit dies 106 and the molding compound 120, as another example. In other words, dimension $d_1$ comprises a distance between a top surface of the molding compound 120 and a top surface of the integrated circuit dies 106 in the view shown in FIG. 7.

The novel structure of the packaging device at the packaging step shown in FIG. 7 comprises integrated circuit dies 106 encapsulated by molding compound 120, yet the molding compound 120 is not disposed over the top surfaces of the integrated circuit dies 106 in the view shown in FIG. 7. The molding compound 120 top surface is higher than the integrated circuit die 106 top surface in the view shown in FIG. 7, for example.

An interconnect structure 122 is formed over the integrated circuit dies 106 and the molding compound 120, as shown in FIG. 8. The interconnect structure 122 includes a plurality of insulating material layers 124 and a plurality of conductive lines 126 and a plurality of conductive vias 128 formed within the insulating material layers 124. The interconnect structure 122 may include a plurality of contact pads 130 formed proximate a surface thereof. The contact pads 130 may comprise ball grid array (BGA) ball mounts in some embodiments, for example. In some embodiments, portions of the interconnect structure 122 comprise an under-ball metallization (UBM) structure, as another example. The insulating material layers 124 may comprise polybenzoxazole (PBO) or other insulators, and the conductive lines 126, conductive vias 128, and contact pads 130 may comprise Cu, Al, other metals, or alloys or multiple layers thereof, in some embodiments, as examples. The plurality of insulating material layers 124, plurality of conductive lines 126, plurality of conductive vias 128, and contact pads 130 of the interconnect structure 122 may be formed using subtractive etch techniques, by damascene techniques, other methods, or combinations thereof, for example. The interconnect structure 122 is disposed over the integrated circuit dies 106 and the molding compound 120, for example.

In some embodiments, the interconnect structure 122 may comprise a redistribution layer (RDL) or a post-passivation interconnect (PPI) structure, for example. In some embodiments, the interconnect structure 122 comprises horizontal electrical connections for the packaged semiconductor devices (see packaged semiconductor devices 140 shown in FIG. 9), for example. The interconnect structure 122 may comprise fan-out electrical connections in some embodiments. In embodiments wherein two or more of the integrated circuit dies 106 are packaged together, the interconnect structure 122 may comprise horizontal electrical connections between the integrated circuit dies 106, for example. Alternatively, the interconnect structure 122 may comprise other types of electrical connection structures.

Because of the step height comprising dimension $d_1$ between the integrated circuit dies 106 and the molding compound 120, a portion of the interconnect structure 122 extends downwardly below a top surface of the molding compound 120 in the view shown in FIG. 8. For example, a portion of a lower level insulating material 124 layer and a lower portion of conductive vias 128 coupled to the contact pads 114 of the integrated circuit dies 106 extend below a top surface of the molding compound 120 to make electrical contact to the integrated circuit dies 106.

Figure 9:
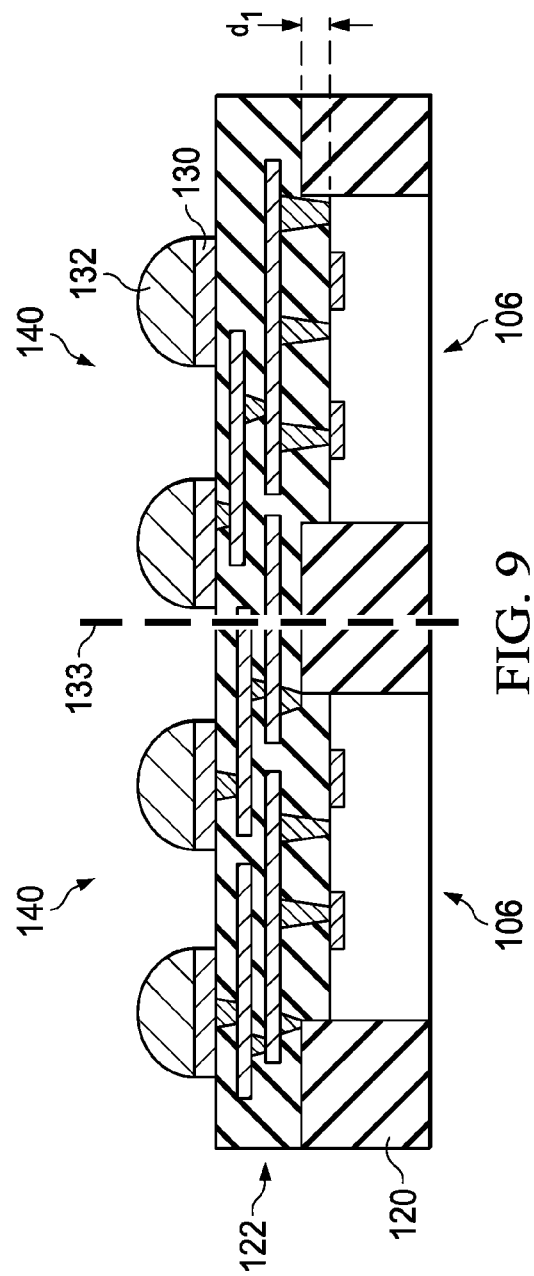

In some embodiments, a plurality of conductors 132 are coupled to the interconnect structure 122, as shown in FIG. 9. The plurality of conductors 132 are coupled to portions of the interconnect structure 122 in some embodiments, for example. The plurality of conductors 132 may be coupled to the contact pads 130 of the interconnect structure 122 in some embodiments, as shown in FIG. 9. The conductors 132 are formed over and are coupled to portions of the horizontal electrical connections of the interconnect structure 122 in some embodiments, for example.

The conductors 132 may comprise a eutectic material such as solder that is coupled to contact pads 130 or bond pads of the interconnect structure 122, for example. The conductors 132 may each comprise a solder bump or a solder ball, as examples. The conductors 132 may function as electrical connectors for the packaged semiconductor device. The eutectic material of the conductors 132 may be re-flowed to electrically and mechanically connect the packaged semiconductor device to another device or object, for example.

The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductors 132 such as solder balls may be formed from SnCu compounds as well, without the use of silver (Ag). Alternatively, lead-free solder connectors may include tin and silver, Sn—Ag, without the use of copper. The conductors 132 may be one among an array of the conductors 132 formed as a grid, referred to as a "ball grid array" or "BGA". The conductors 132 may alternatively be arranged in other shapes. The conductors 132 may also comprise non-spherical conductive connectors, for example. In some embodiments, the conductors 132 are not included.

Figure 10:
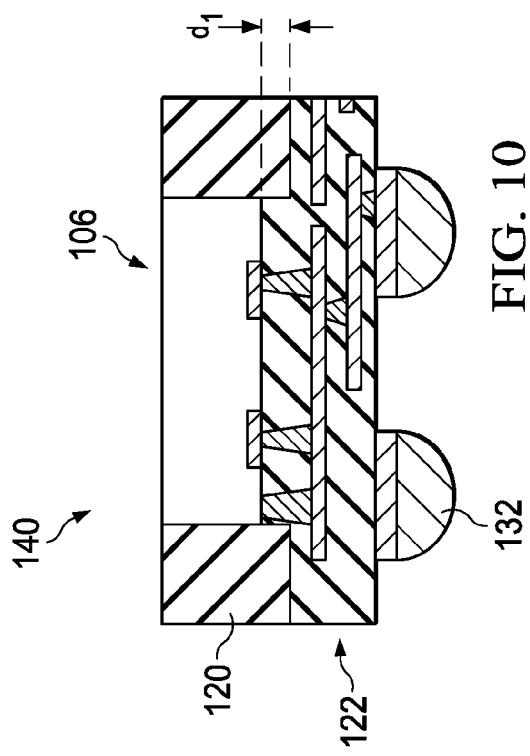

In some embodiments, the interconnect structure 122 and the molding compound 120 are singulated using a die saw, laser, or other device to form a plurality of packaged semiconductor devices 140, as shown in FIG. 10, with each of the plurality of packaged semiconductor devices 140 including one of the plurality of integrated circuit dies 106. The interconnect structure 122 and the molding compound 120 may be singulated on scribe lines 133 between adjacent integrated circuit dies 106, as shown in FIG. 9, for example. In some embodiments, the packaged semiconductor devices 140 may be attached to a dicing tape (not shown) before the singulation process, and the dicing tape is removed after the singulation process.

In other embodiments, the interconnect structure 122 and the molding compound 120 are singulated to form a plurality of packaged semiconductor devices 140 (see FIGS. 13, 14 and 15), each of the plurality of packaged semiconductor devices 140 including two or more of the plurality of integrated circuit dies 106. The integrated circuit dies 106 packaged together in the packaged semiconductor device 140 may comprise similar, the same, or different functions, for example. The molding compound 120 is disposed around the integrated circuit dies 106 and between adjacent integrated circuit dies 106.

FIGS. 11 and 12 illustrate cross-sectional views of a method of packaging semiconductor devices at various stages in accordance with some embodiments. After the packaging process steps shown in FIGS. 1 through 7, a plurality of through-vias 138 are formed within the molding compound 120. The through-vias 138 may be formed using an etch process or laser drilling process after the molding compound 120 is applied to form apertures in the molding compound 120, and a conductive material may be filled into the apertures using a deposition or plating process to form the through-vias 138, for example. In other embodiments, before the integrated circuits dies 106 are attached to the carrier 100, the through-vias 138 may be plated onto the carrier 100 by forming a seed layer over the carrier 100, forming a photoresist over the seed layer, patterning the photoresist using a lithography process, and plating a conductive material such as Cu, a Cu alloy, or other metals over the seed layer through the patterned photoresist to form the through-vias 138. The photoresist is then removed. The packaging process steps shown in FIGS. 4 through 7 are then performed. Alternatively, the through-vias 138 may be formed using other methods. The packaging process steps shown in FIGS. 8 and 9 are then performed, to form the interconnect structure 122 and conductors 132, as shown in FIG. 12, and the packaged semiconductor devices 140' are singulated along scribe lines 133.

Figure 13:
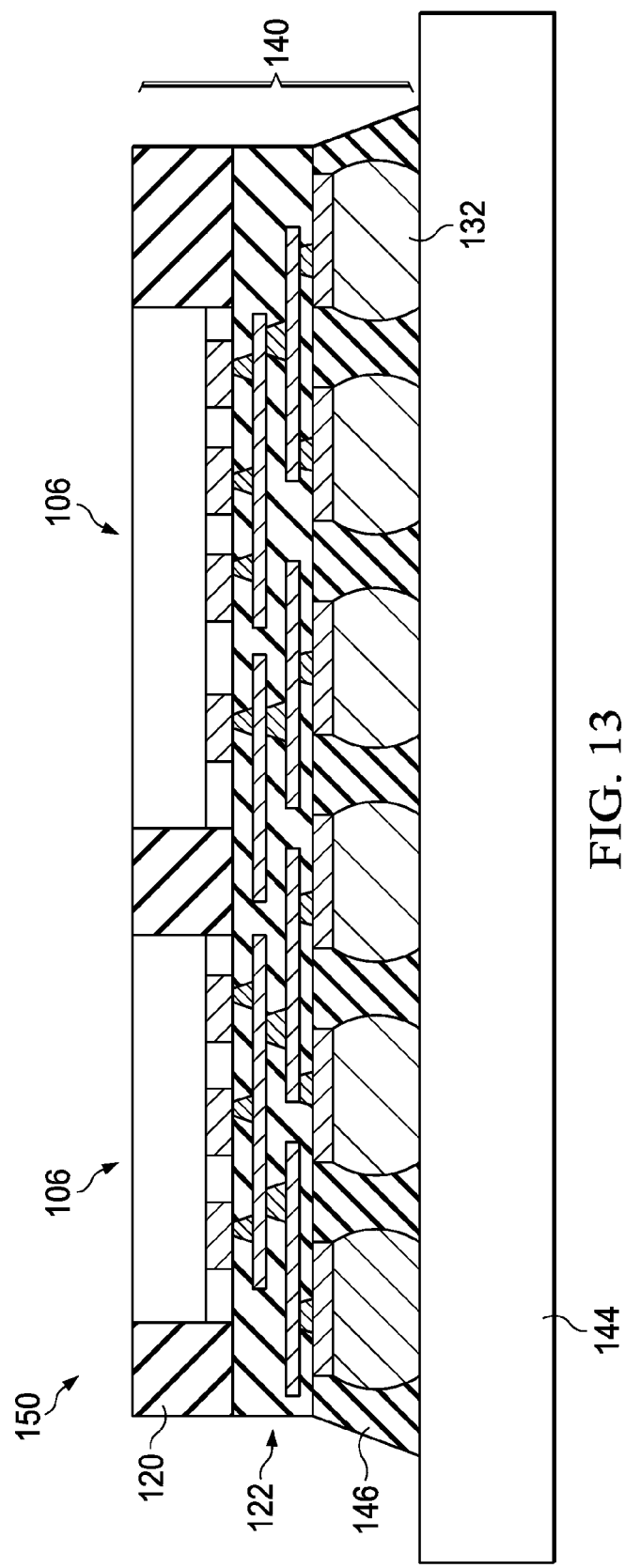
FIG. 13 is a cross-sectional view illustrating a packaged semiconductor device in accordance with some embodiments.

In some embodiments, the plurality of conductors 132 of the packaged semiconductor devices 140 (and also packaged semiconductor devices 140', not shown) are coupled to a substrate 144, as shown in FIG. 13 in a cross-sectional view. The substrate 144 may comprise a printed circuit board (PCB) in some embodiments. Alternatively, the substrate 144 may comprise other materials, such as an interposer, another integrated circuit die, or other objects, as example. The packaged semiconductor device 150 includes the packaged semiconductor device 140 that is coupled to the substrate 144.

In some embodiments, an underfill material 146 may be disposed between the plurality of conductors 132 and between the substrate 144 and the interconnect structure 122, also illustrated in FIG. 13. The underfill material 146 may comprise an epoxy material, a $SiO_2$ filler or other fillers, or other materials, as example. The underfill material 146 may be applied using a needle along one or more sides of the packaged semiconductor device 150 or through an aperture formed within the molding compound 120 and interconnect structure 122, for example, not shown.

Figure 14:
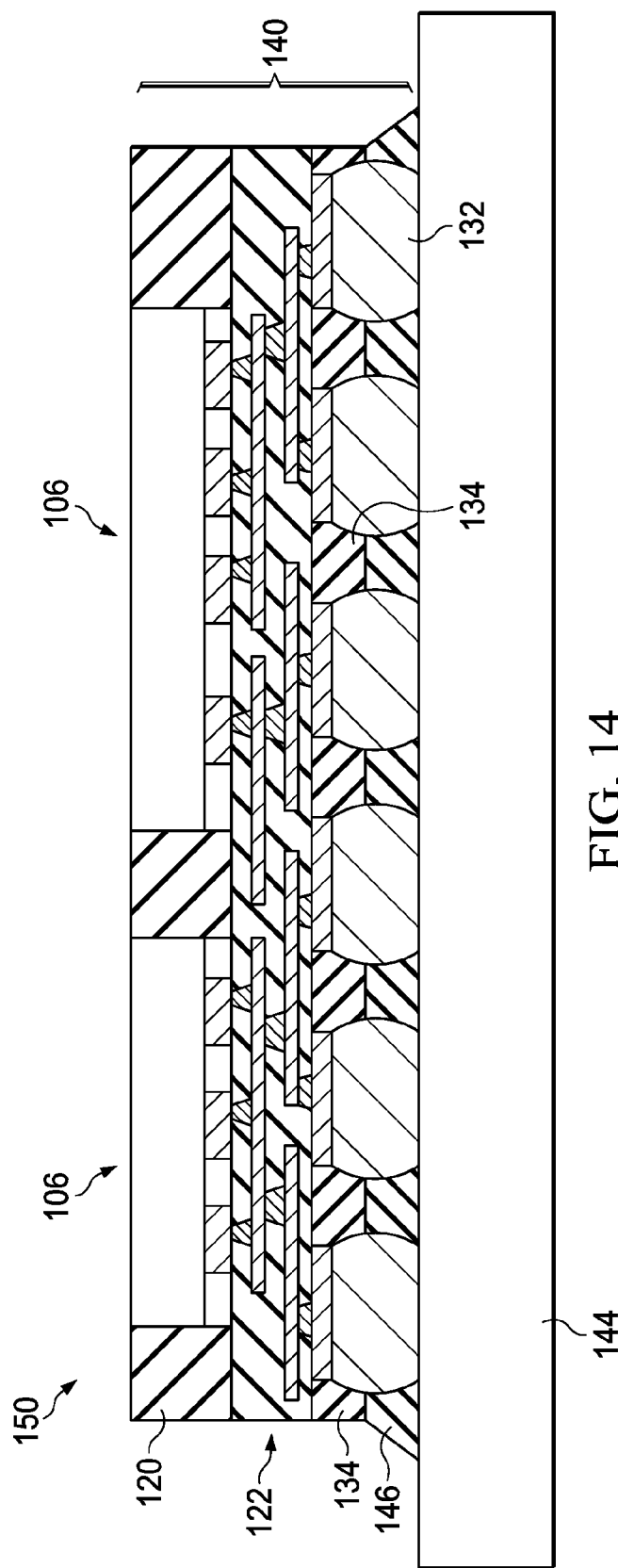
FIG. 14 is a cross-sectional view illustrating a packaged semiconductor device in accordance with other embodiments.

The molding compound 120 is also referred to herein as a first molding compound 120. In some embodiments, a second molding compound 134 is disposed around the plurality of conductors 132, as shown in FIG. 14. The second molding compound 134 may comprise similar materials described for the first molding compound 120, for example. In some embodiments, the second molding compound 134 comprises an LMC. In some embodiments, the second molding compound 134 is not included. In other embodiments, the second molding compound 134 is included, and an underfill material 146 is not included, not shown.

In some embodiments, the second molding compound 134 is included, and an underfill material 146 is also included in the packaged semiconductor device 150, also shown in FIG. 14. The second molding compound 134 may be disposed between the plurality of conductors 132 and between the underfill material 146 and the interconnect structure 122, for example.

Figure 15:
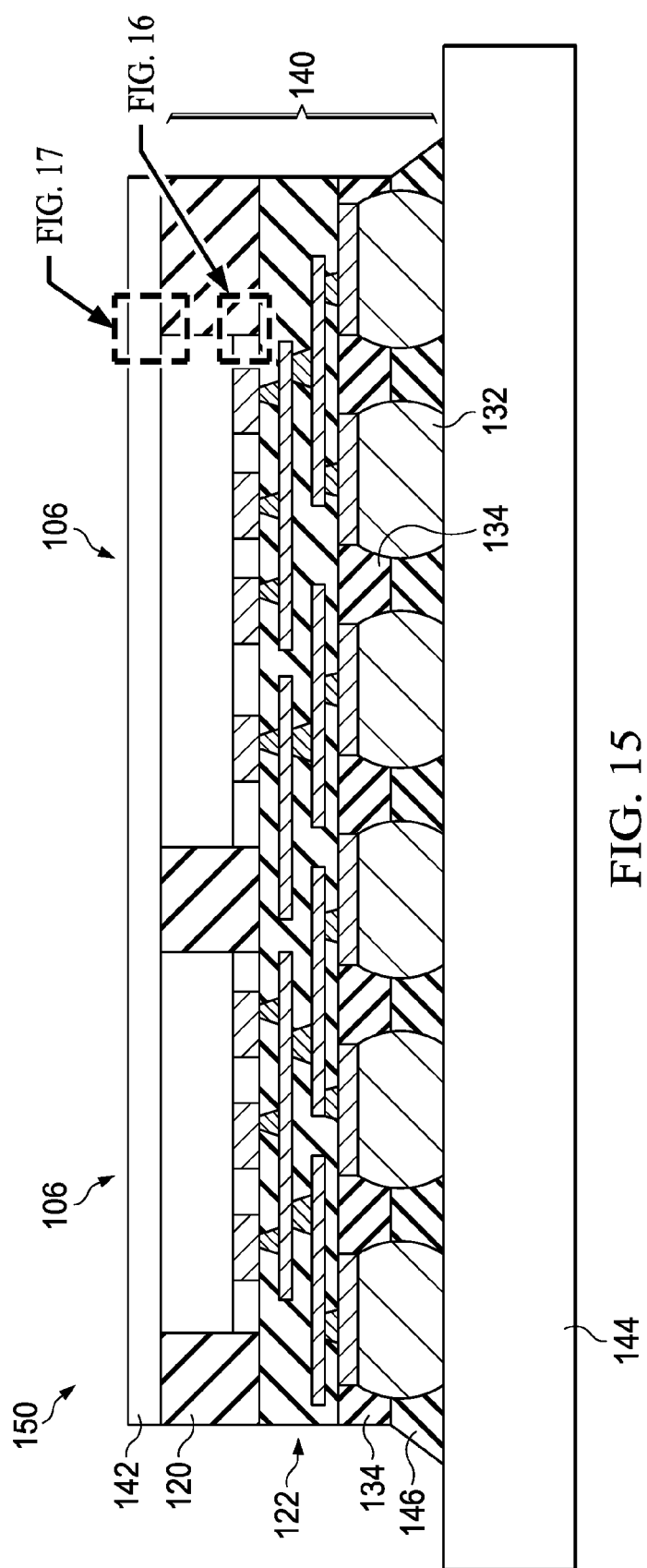
FIG. 15 is a cross-sectional view illustrating a packaged semiconductor device in accordance with some embodiments.

In some embodiments, a lid, a heat spreader, or a backside protective film 142 is disposed over the molding compound 120 and the integrated circuit die or dies 106, as shown in FIG. 15. The lid or heat spreader 142 may comprise Al, Cu, alloys thereof, ceramic, or other materials comprising a thickness of about 100 µm to about 1,000 µm, or other dimensions, as examples. The protective film 142 may comprise about 10 µm to about 100 µm of a polymer, an epoxy, or other materials, as examples. The lid, heat spreader, or backside protective film 142 may be attached using an adhesive or formed using a deposition or coating process, for example. Alternatively, a lid, heat spreader, or backside protective film 142 may not be included.

In some embodiments, the interconnect structure 122 is disposed over a first side of the integrated circuit die or dies 106 and the molding compound 120 (e.g., the bottom side in the view shown in FIG. 15). The lid, heat spreader, or backside protective film 142 is disposed over a second side of the integrated circuit die or dies 106 and the molding compound 120 (e.g., the top side in the view shown in FIG. 15). The second side is opposite the first side of the integrated circuit die or dies 106 and the molding compound 120.

Figure 16:
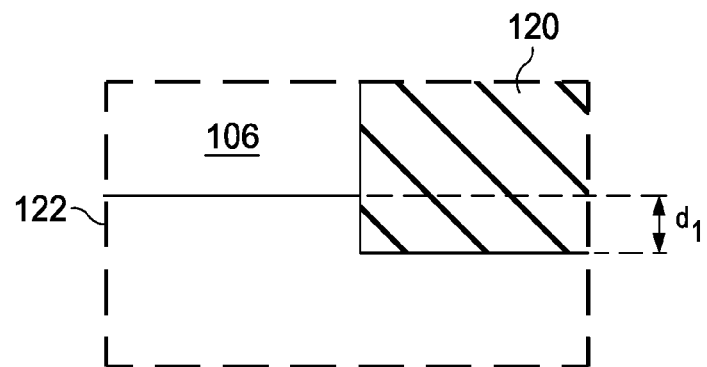
FIGS. 16 and 17 are more detailed views of portions of the packaged semiconductor device shown in FIG. 15 in accordance with some embodiments.
Figure 17:
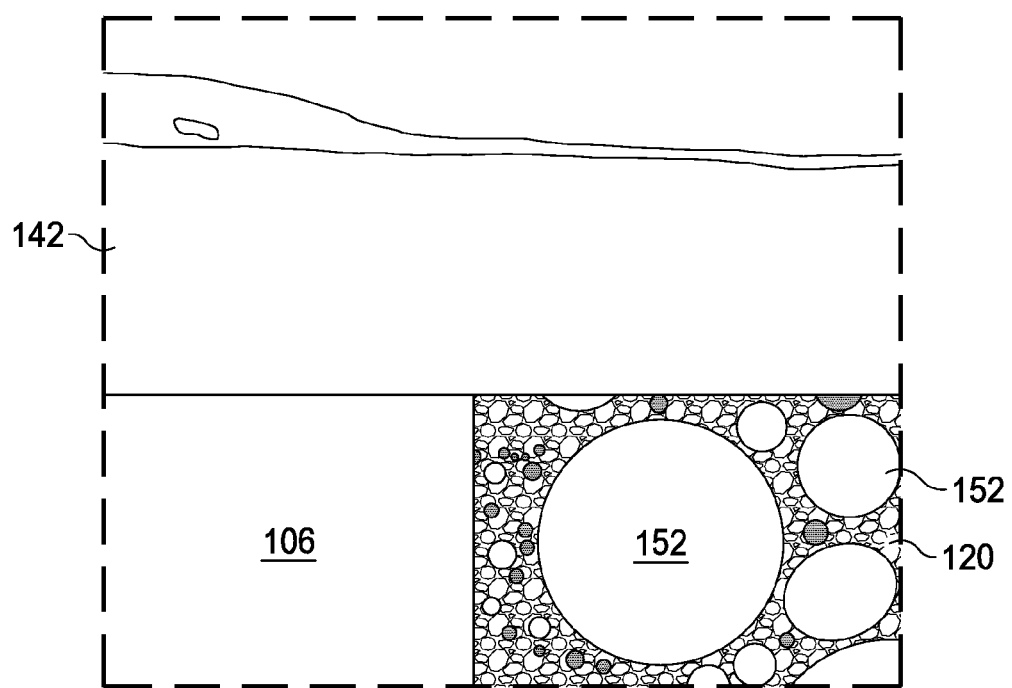

FIGS. 16 and 17 are more detailed views of portions of the packaged semiconductor device 150 shown in FIG. 15 in accordance with some embodiments. FIG. 16 shows a cross-sectional view of a lower corner of an integrated circuit die 106 proximate the molding compound 120. A portion of the interconnect structure 122 comprising dimension $d_1$ due to the step height between the molding compound and the integrated circuit die 106 is shown; e.g., after applying the molding compound 120, the integrated circuit die 106 surface is different than the molding compound 120 surface. The step height comprising dimension $d_1$ advantageously prevents or reduces a recess from forming between the integrated circuit dies 106 proximate the interconnect structure 122 and/or molding compound 120, e.g., which may form during a curing process for the molding compound 120 or from grinding processes used to package the semiconductor devices.

In some embodiments, the molding compound 120 includes a filler that comprises glass spheres 152, as shown in FIG. 17 in a cross-sectional view. Advantageously, grinding processes used in the packaging processes are prevented from deleteriously affecting the filler materials of the molding compound 120, because of the inclusion of the backside protective film 142 in some embodiments, for example.

Figure 18:
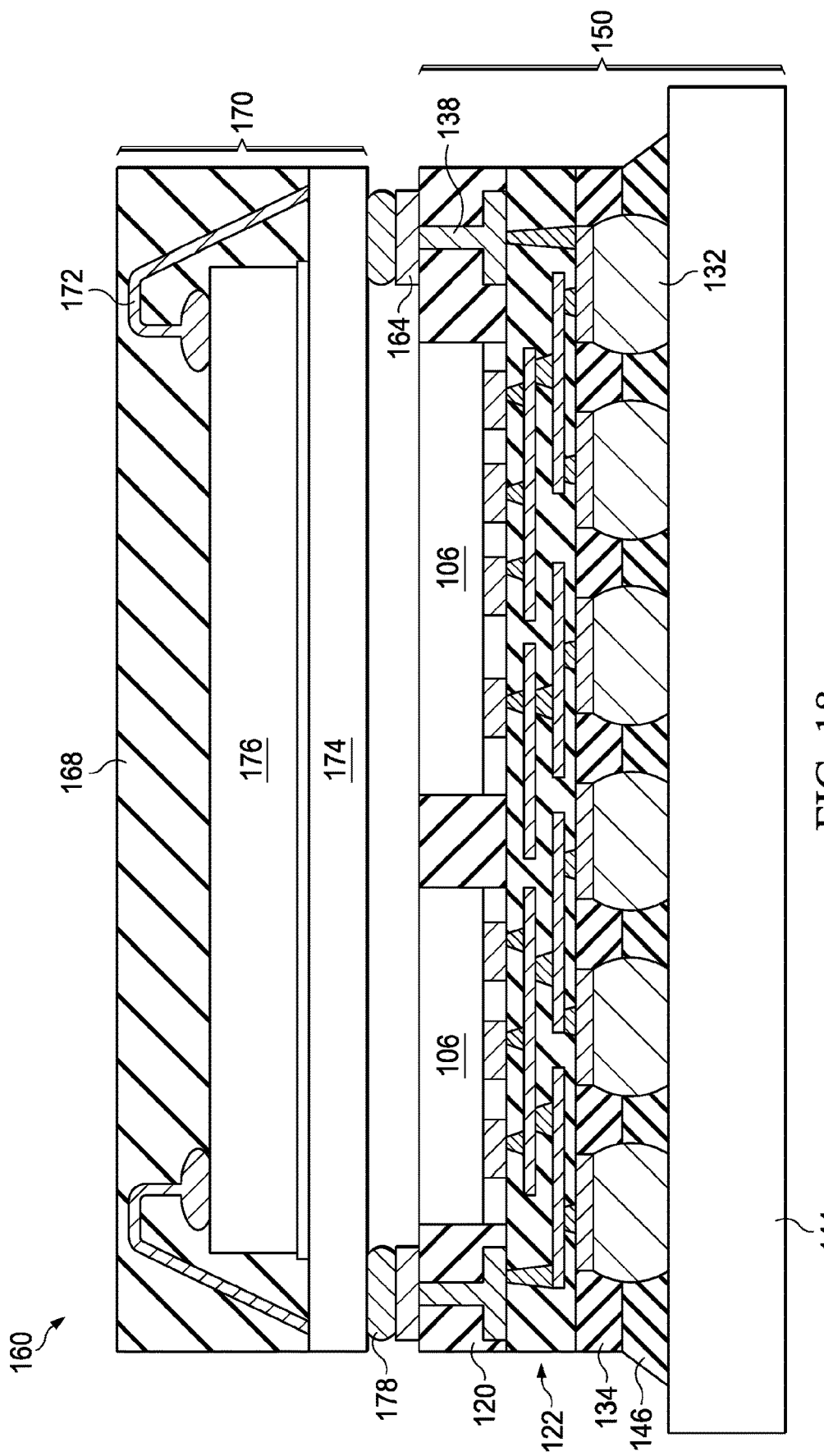
FIG. 18 is a cross-sectional view illustrating a packaged semiconductor device in accordance with some embodiments.

FIG. 18 is a cross-sectional view illustrating a packaged semiconductor device 160 in accordance with some embodiments. The packaged semiconductor device 160 comprises a package-on-a package (PoP) device in accordance with some embodiments. The PoP device 160 includes a packaged semiconductor device 150 described herein that is coupled to a packaged semiconductor device 170. The packaged semiconductor device 150 comprises a first packaged semiconductor device, and the packaged semiconductor device 170 comprises a second packaged semiconductor device that is coupled to the packaged semiconductor device 150 in accordance with some embodiments, for example.

The packaged semiconductor device 150 includes a plurality of through-vias 138 formed within the molding compound 120. The through-vias 138 provide vertical connections for the packaged semiconductor devices 150 and 160. Contact pads 164 are coupled to the through-vias 138. The contact pads 164 may be formed over or within the molding compound 120, as illustrated in FIG. 18. The contact pads 164 of the packaged semiconductor device 150 are coupled to contact pads (not shown) of packaged semiconductor device 170 by conductors 178 which may comprise solder balls or other materials. The conductors 178 may comprise similar materials described for conductors 132, for example.

Packaged semiconductor device 170 includes one or more integrated circuit dies 176 coupled to a substrate 174. Wire bonds 172 may be coupled to contact pads on a top surface of the integrated circuit die or dies 176, which are coupled to bond pads (not shown) on the substrate 174. A molding compound 168 may be disposed over the wire bonds 172, integrated circuit die or dies 176, and the substrate 174.

Alternatively, a PoP device 160 may include two packaged semiconductor devices 150 described herein that are coupled together in some embodiments, not shown in the drawings. In some embodiments, the PoP device 160 may comprise a system-on-a-chip (SOC) device, as another example.

In FIGS. 13 through 15 and 18, the step height comprising dimension $d_1$ is not shown; however, the packaged semiconductor devices 150 and 160 shown in FIGS. 13 through 15 and 18 include the step height between the molding compound 120 and the integrated circuit dies 106 that is shown in FIGS. 7 through 12, in accordance with some embodiments of the present disclosure.

Figure 19:
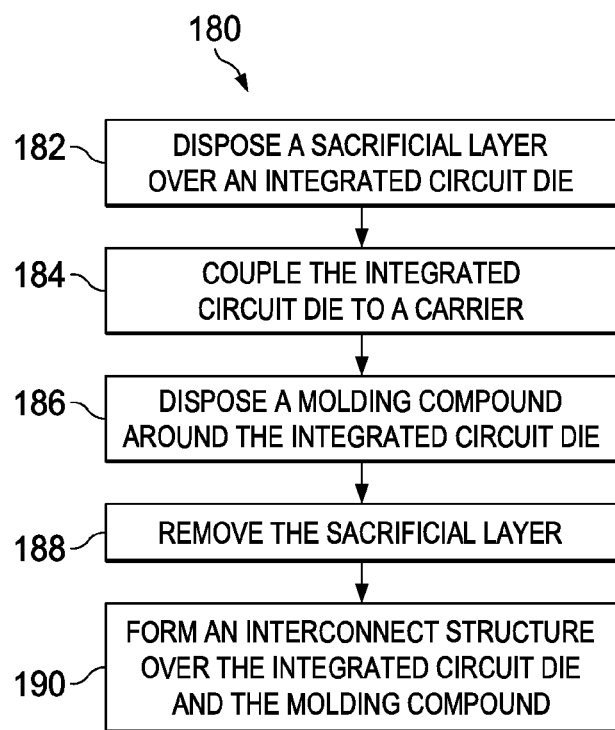
FIG. 19 is a flow chart of a method of packaging a semiconductor device in accordance with some embodiments.

FIG. 19 is a flow chart 180 of a method of packaging semiconductor devices in accordance with some embodiments. In step 182, a sacrificial layer 108 (see also FIG. 2) is disposed over an integrated circuit die 106. In step 184, the integrated circuit die 106 is coupled to a carrier 100 (FIG. 4). In step 186, a molding compound 120 is disposed around the integrated circuit die 106 (FIG. 5). In step 188, the sacrificial layer 108 is removed (FIG. 7). In step 190, an interconnect structure 122 is formed over the integrated circuit die 106 and the molding compound 120 (FIG. 8).

Embodiments of the present disclosure include methods of packaging semiconductor devices, and also include packaged semiconductor devices that have been packaged using the methods described herein. Some embodiments include PoP devices that include the packaged semiconductor devices described herein. Some embodiments are particularly beneficial when implemented in wafer level packaging (WLP) applications, fan-out WLP (FOWLP) applications, 2D packages, 3D packages, and other types of packaging, as examples.

Advantages of some embodiments of the present disclosure include providing a novel sacrificial layer 108 and packaging process that results in reduced recessing between a molding compound and integrated circuit dies encapsulated by the molding compound. The sacrificial layer 108 also prevents or reduces overflow of the molding compound over the integrated circuit dies, preventing molding compound residue from forming on the integrated circuit dies in some embodiments. Residual molding compound that may form over the sacrificial layer 108 is removed when the sacrificial layer 108 is removed, thus avoiding a need for a grinding process to remove excess molding compound from over the integrated circuit dies. The sacrificial layer 108 also prevents failure of the interconnect structures by preventing or reducing recesses between the molding compound and integrated circuit dies. Increased packaging yields are achievable by implementing embodiments of the present disclosure. Furthermore, the novel packaged semiconductor devices and methods are easily implementable into packaging process flows.

In an embodiment, a device includes: a first integrated circuit die; a first molding compound at least laterally encapsulating the first integrated circuit die; a through via extending through the first molding compound; and a redistribution structure including: a dielectric layer over the first molding compound, a first portion of the dielectric layer being at least partially disposed beneath a topmost surface of the first molding compound, a second portion of the dielectric layer being disposed above the topmost surface of the first molding compound; and a metallization pattern having a conductive line extending along the dielectric layer, a first conductive via extending through the first portion of the dielectric layer to physically and electrically couple to the first integrated circuit die, and a second conductive via extending through the second portion of the dielectric layer to physically and electrically couple to the through via.

In some embodiments of the device, a first height of the first conductive via is less than a second height of the second conductive via. In some embodiments of the device, a difference between the first height and the second height is in a range of from 2 μm to 5 μm. In some embodiments of the device, the dielectric layer and the first integrated circuit die both contact a first sidewall of the first molding compound. In some embodiments, the device further includes: a package substrate; conductive connectors electrically coupling the package substrate to the metallization pattern; and an underfill surrounding the conductive connectors. In some embodiments, the device further includes: a second molding compound disposed between the underfill and the redistribution structure, the second molding compound surrounding at least a portion of the conductive connectors. In some embodiments, the device further includes: a second integrated circuit die electrically coupled to the through via, the second integrated circuit die and the redistribution structure being disposed at opposing sides of the first integrated circuit die. In some embodiments, the device further includes: a heat spreader attached to the first integrated circuit die and the first molding compound, the first integrated circuit die being disposed between the heat spreader and the redistribution structure.

In an embodiment, a device includes: a first integrated circuit die; a redistribution structure over the first integrated circuit die, the redistribution structure physically and electrically coupled to the first integrated circuit die; a first molding compound at least laterally encapsulating the first integrated circuit die and a lower portion of the redistribution structure, an upper portion of the redistribution structure being disposed over the first molding compound; and a through via extending through the first molding compound, the through via physically and electrically coupled to the redistribution structure.

In some embodiments of the device, a first height of the first integrated circuit die is less than a second height of the through via. In some embodiments of the device, a difference between the first height and the second height is in a range of from 2 μm to 5 μm. In some embodiments of the device, the redistribution structure includes: insulating material layers; conductive lines disposed within the insulating material layers; and conductive vias disposed within and extending through the insulating material layers, where a first conductive via of the conductive vias has a lower portion and an upper portion over the lower portion, the lower portion of the first conductive via extending below a major surface of the first molding compound to physically and electrically couple to the first integrated circuit die, the upper portion of the first conductive via extending above the major surface of the first molding compound to physically and electrically couple to one of the conductive lines. In some embodiments, the device further includes: a package substrate; conductive connectors electrically coupling the package substrate to the redistribution structure; and an underfill surrounding the conductive connectors. In some embodiments, the device further includes: a second molding compound disposed between the underfill and the redistribution structure, the second molding compound surrounding at least a portion of the conductive connectors. In some embodiments, the device further includes: a second integrated circuit die electrically coupled to the through via, the second integrated circuit die and the redistribution structure being disposed at opposing sides of the first integrated circuit die. In some embodiments, the device further includes: a heat spreader attached to the first integrated circuit die and the first molding compound, the first integrated circuit die being disposed between the heat spreader and the redistribution structure.

In an embodiment, a device includes: a first integrated circuit die having a first height; a first molding compound at least laterally encapsulating the first integrated circuit die, the first molding compound having a second height, the second height being greater than the first height; a redistribution structure adjacent the first molding compound and the first integrated circuit die; and a heat spreader adjacent the first molding compound and the first integrated circuit die, the first molding compound and the first integrated circuit die being disposed between the heat spreader and the redistribution structure.

In some embodiments, the device further includes: a package substrate; conductive connectors electrically coupling the package substrate to the redistribution structure; and an underfill surrounding the conductive connectors. In some embodiments, the device further includes: a second molding compound disposed between the underfill and the redistribution structure, the second molding compound surrounding at least a portion of the conductive connectors. In some embodiments of the device, a difference between the first height and the second height is in a range of from 2 μm to 5 μm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    an integrated circuit die having a first height;
    a molding compound laterally encapsulating the integrated circuit die, the molding compound having a second height, the second height greater than the first height, the first height and the second height each measured with respect to a backside of the integrated circuit die;
    a heat spreader disposed at a backside of the molding compound and the backside of the integrated circuit die;
    an interconnect structure disposed at a front side of the molding compound and a front side of the integrated circuit die; and
    a reflowable connector electrically connected to the interconnect structure.

2. The device of claim 1, wherein the interconnect structure comprises:
    a first conductive via electrically connecting the reflowable connector to the integrated circuit die.

3. The device of claim 2, wherein the interconnect structure further comprises:
    insulating material layers; and
    a plurality of conductive vias disposed within the insulating material layers, the first conductive via being one of the plurality of conductive vias.

4. The device of claim 1, wherein the interconnect structure comprises a contact pad, the device further comprising:
    a package substrate, the reflowable connector electrically connecting the package substrate to the contact pad.

5. The device of claim 4, wherein the molding compound laterally encapsulates a first portion of the interconnect structure, a second portion of the interconnect structure disposed between the molding compound and the package substrate.

6. The device of claim 1, wherein the first height and the second height are each in a range of 100 μm to 500 μm.

7. The device of claim 1, wherein the heat spreader is a copper lid, the copper lid attached to the backside of the molding compound and the backside of the integrated circuit die with an adhesive.

8. A device comprising:
    a first integrated circuit die having a first surface and a second surface opposite the first surface, the first integrated circuit die comprising a first contact pad at the first surface;
    a first molding compound disposed around the first integrated circuit die, first molding compound having a third surface and a fourth surface opposite the third surface, the first molding compound being thicker than the first integrated circuit die in a first direction, the first direction extending between the third surface and the fourth surface, the fourth surface being coplanar with the second surface;

an interconnect structure adjacent a major surface of the first molding compound and the first surface of the first integrated circuit die, the interconnect structure comprising a first conductive via; and a reflowable connector electrically connected to the first contact pad by the first conductive via.

9. The device of claim 8, wherein the interconnect structure further comprises:
   insulating material layers; and
   a plurality of conductive vias disposed within the insulating material layers, the first conductive via being one of the plurality of conductive vias.

10. The device of claim 8, wherein the interconnect structure comprises a second contact pad, the device further comprising:
    a package substrate, the reflowable connector electrically connecting the package substrate to the second contact pad; and
    an underfill surrounding the reflowable connector.

11. The device of claim 8, wherein the first molding compound is from 2 μm to 5 μm thicker than the first integrated circuit die.

12. The device of claim 8 further comprising:
    a heat spreader adjacent the second surface of the first integrated circuit die and the fourth surface of the first molding compound.

13. The device of claim 12, wherein the heat spreader is a copper lid, the copper lid attached to the second surface of the first integrated circuit die and the fourth surface of the first molding compound with an adhesive.

14. The device of claim 8 further comprising:
    a second integrated circuit die adjacent the second surface of the first integrated circuit die and the fourth surface of the first molding compound; and
    a through-via extending through the first molding compound, the through-via electrically connecting the second integrated circuit die to the first integrated circuit die.

15. The device of claim 14 further comprising:
    a second molding compound disposed around the second integrated circuit die.

16. A device comprising:
    a heat spreader;
    an interconnect structure comprising a first conductive via;
    a molding compound between the interconnect structure and the heat spreader, the molding compound having a first thickness measured in a first direction, the first direction extending from the heat spreader to the interconnect structure;
    an integrated circuit die in the molding compound, the integrated circuit die having a second thickness measured in the first direction, the second thickness less than the first thickness;
    a reflowable connector electrically connected to the integrated circuit die by the first conductive via;
    a package substrate electrically connected to the reflowable connector; and
    an underfill surrounding the reflowable connector.

17. The device of claim 16, wherein the heat spreader is a copper lid, the copper lid attached to the integrated circuit die with an adhesive.

18. The device of claim 16, wherein the first thickness and the second thickness are each in a range of 100 μm to 500 μm.

19. The device of claim 16, wherein the molding compound is from 2 μm to 5 μm thicker than the integrated circuit die.

20. The device of claim 16, wherein the interconnect structure further comprises:
    insulating material layers; and
    a plurality of conductive vias disposed within the insulating material layers, the first conductive via being one of the plurality of conductive vias.

* * * * *